(12) United States Patent
Kim

(10) Patent No.: US 7,254,201 B2
(45) Date of Patent: Aug. 7, 2007

(54) CLOCK AND DATA RECOVERY CIRCUIT AND METHOD

(75) Inventor: Ju-Hyung Kim, Seoul (KR)

(73) Assignee: Samsung Electronics, Co. Ltd. (KR)

( * ) Notice: Subject to any disclaimer, the term of this patent is extended or adjusted under 35 U.S.C. 154(b) by 791 days.

(21) Appl. No.: 10/634,279

(22) Filed: Aug. 5, 2003

(65) Prior Publication Data

US 2004/0036516 A1    Feb. 26, 2004

(30) Foreign Application Priority Data

Aug. 20, 2002    (KR) ...................... 10-2002-0049325

(51) Int. Cl.
*H04L 7/00*    (2006.01)
(52) U.S. Cl. ...................... 375/354; 375/326; 375/327; 375/355; 375/376
(58) Field of Classification Search ................ 375/327, 375/326, 354, 355, 376
See application file for complete search history.

(56) References Cited

U.S. PATENT DOCUMENTS

| | | | | |
|---|---|---|---|---|
| 5,928,293 A | * | 7/1999 | Jobling et al. | ................... 701/2 |
| 6,584,163 B1 | * | 6/2003 | Myers et al. | ................ 375/360 |
| 6,954,506 B2 | * | 10/2005 | Cho | ........................... 375/321 |

* cited by examiner

*Primary Examiner*—Dac Ha
*Assistant Examiner*—Ted M. Wang
(74) *Attorney, Agent, or Firm*—Mills & Onello LLP

(57) ABSTRACT

In a clock and data recovery circuit and method, the clock and data recovery circuit comprises a clock signal generator for generating N clock signals, each clock signal having phase difference of 360/N×K from each other, wherein the N denotes an integer and the K denotes an integer from 0 to N−1, a phase selector for generating an I+2$_{th}$ clock signal out of the N clock signals as a recovered clock signal if an I$_{th}$ clock signal is on a first state and an I+1$_{th}$ clock signal is on a second state when logic level transition of a received data is detected, wherein the I denotes an integer from 1 to N, and a recovered data generator for generating a recovered data synchronized with the recovered clock signal by using the received data in response to the recovered clock signal output from the phase selector.

6 Claims, 6 Drawing Sheets

CLOCK AND DATA RECOVERY CIRCUIT AND METHOD

RELATED APPLICATIONS

This application claims priority to Korean Patent Application No. 2002-49325, filed on Aug. 20, 2002.

BACKGROUND OF THE INVENTION

1. Field of the Invention

The present invention relates to a clock and data recovery circuit and method capable of generating clock signals that are synchronized with received data.

2. Description of the Related Art

Universal Serial Bus (USB) is an interface standard for data transmission between a computer and its peripheral devices. For data communication between a computer and a peripheral device according to the USB interface standard, there are several requirements. For example, a computer and a peripheral device must have a USB transmission unit and a USB receiving unit therein, respectively. Also, a clock signal is not transmitted between the USB transmission unit and the USB receiving unit. Instead, only Non-Return-to-Zero (NRZ) or Non-Return-to-Zero-Inverted (NRZI) data is transmitted between the USB transmission unit and the USB receiving unit. Accordingly, a clock signal is recovered in the USB receiving unit using the received data.

Generally, the USB transmission unit and the USB receiving unit use the same clock signal, so the clock signal used by the USB transmission unit usually has the same frequency as the clock signal used by the USB receiving unit but has a different phase. Typically, the USB receiving unit has a clock and data recovery circuit for recovering the clock signal having the same frequency and phase as the clock signal used by the USB transmission unit, and generates a recovered clock signal that is synchronized with the received data.

FIG. 1 illustrates an example of a clock and data recovery circuit, in accordance with the present invention. Referring to FIG. 1, a conventional clock and data recovery circuit comprises a phase detector 10, a bi-directional shift register 12, a phase selector 14, a clock generator 16 and a multi-phase clock generator 18.

The phase detector 10 generates a down signal DN when received data RDATA leads a recovered clock signal RCCK in phase, and generates an up signal UP when the received data lags the recovered clock signal RCCK in phase, after comparing the phases of the received data RDATA and the recovered clock signal RCCK. The bi-directional shift register 12 counts down in response to the down signal DN and counts up in response to the up signal UP, and generates a control signal CON. The phase selector 14 selects one clock signal from a plurality of clock signals P1, P2, P3, . . . , Pn output from the multi-phase clock generator 18, and outputs the selected clock signal as a recovered clock signal RCCK. The clock generator 16 generates a receiving clock signal RXCK. The multi-phase clock generator 18 receives the receiving clock signal RXCK, and generates n clock signals P1, P2, P3, . . . , Pn which have the same frequency and different phases from each other by as much as 360/N×K, wherein K is an integer between zero to N−1. If, N is 8, 8 clock signals are generated from the multi-phase clock generator 18, and the generated clock signals have phase differences from each other by as much as 45 degrees, so that the 8 clock signals have phases 0, 45, 90, 135, 180, 225, 270 and 315 degrees, respectively. The receiving clock signal RXCK generated by the clock generator 16 has the same frequency as a clock signal which is used in the USB transmission unit (not shown), for transmitting the received data RDATA.

FIG. 2 is a timing diagram showing the operation of the clock and data recovery circuit shown in FIG. 1.

First, the phase detector 10 compares the respective phases of the received data RDATA and the recovered clock signal RCCK. If an initial value of a control signal CON output from the bi-directional shift register is 1 and the phase selector 14 selects a clock signal CK0, the recovered clock signal RCCK is the clock signal CK0. Accordingly, at this time, the phase detector 10 generates an up signal UP because the received data lags the recovered clock signal in phase. Then, the bi-directional shift register 12 counts up and increments the value of the control signal to 2. The phase selector 14 generates a clock signal CK45 as the recovered clock signal RCCK in response to the incremented control signal CON having the value 2. The phase detector 10 again compares the phases of the received data RDATA and the recovered clock signal RCCK, and generates the up signal UP because the received data RDATA lags the recovered clock signal RCCK in phase. Then, the bi-directional shift register counts up and the value of the control signal CON increments to 3. Then, the phase selector 14 generates a clock signal CK90 as the recovered clock signal in response to the control signal CON. The phase detector 10 compares the phases of the received data RDATA and the recovered clock signal RCCK, and generates a down signal DN because the received data RDATA leads the recovered clock signal RCCK in phase. Then, the bi-directional shift register 12 counts down and decrements the value of the control signal CON to be 2.

In the manner described above, the clock and data recovery circuit shown in FIG. 1 generates the recovered clock signal in synchronization with the received data, and the clock signal CK45 and the clock signal CK90 are alternately generated as the recovered clock signal RCCK.

Accordingly, the clock and data recovery circuit in accordance with the conventional art is limited in that it does not generate the recovered clock signal RCCK in precise synchronization with the received data RDATA. Also, the conventional art is limited in that it requires a maximum of N clock periods in order to generate the recovered clock signal RCCK in relative synchronization with the received data.

If the N is set to a small number to synchronize the received data RDATA with the recovered clock signal RCCK within a short period, the phase difference between the received data RDATA and the recovered clock signal RCCK becomes greater even though the received data RDATA and the recovered clock signal RCCK are synchronized.

SUMMARY OF THE INVENTION

It is a feature of the present invention to provide a clock and data recovery circuit capable of generating a recovered clock signal precisely synchronized with received data.

It is another feature of the present invention to provide a clock and data recovery circuit capable of synchronizing a recovered clock signal with received data within one clock cycle.

It is further another feature of the present invention to provide a clock and data recovery method capable of achieving the features described above and other features.

In accordance with one aspect of the present invention, there is provided a clock and data recovery circuit comprising a clock signal generator for generating a plurality of clock signals, each clock signal having a different phase with respect to the others. A phase selector selects one of the clock signals of the plurality of clock signals as a recovered clock signal if a first of the plurality of clock signals is in a first state and if a second of the plurality of clock signals is in a second state when a logic level transition of a received data is detected. A recovered data generator generates a recovered data that is synchronized with the recovered clock signal output from the phase selector, using the received data.

The clock signals for example have a phase difference of 360/N×K from each other, wherein N denotes an integer and wherein K denotes an integer from 0 to N−1. The phase selector generates an I+2$_{th}$ clock signal out of the N clock signals as the recovered clock signal, wherein the first of the plurality of clock signals is an I$_{th}$ clock signal and wherein the second of the plurality of clock signals is an I+1$_{th}$ clock signal, wherein I denotes an integer from 1 to N.

The phase selector comprises, for example, N flip-flops for receiving the N clock signals and generating N clock signals and N complementary clock signals when a level transition of the received data is detected; N AND gates for performing AND operation of an I$_{th}$ complementary clock signal and an I+1$_{th}$ clock signal out of the N clock signals and the N complementary clock signals; and N switches for generating the I+2$_{th}$ clock signal as the recovered clock signal in response to corresponding output signals of the N AND gates.

The recovered data generator receives the received data and generates the recovered data in response to the complementary signal of the recovered clock signal.

In another aspect, the present invention is directed to a method for recovering clock and data information from a signal. A plurality of clock signals are generated, each clock signal having a different phase with respect to the others. One of the clock signals of the plurality of clock signals is selected as a recovered clock signal if a first of the plurality of clock signals is in a first state and if a second of the plurality of clock signals is in a second state when a logic level transition of a received data is detected. A recovered data that is synchronized with the recovered clock signal is generated as an output from the phase selector, using the received data.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF PREFERRED EMBODIMENTS

Figure 1:
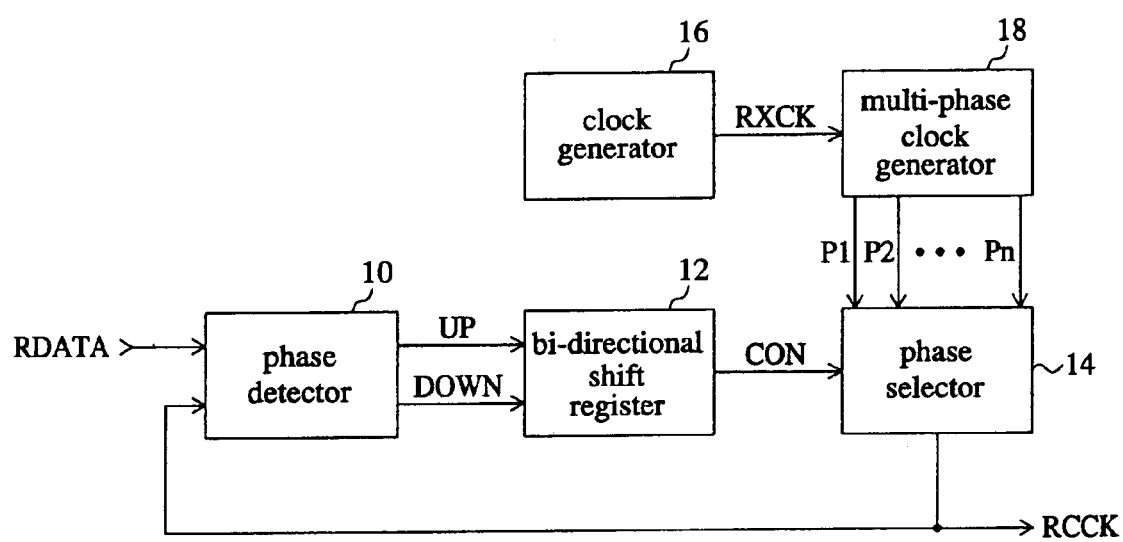
FIG. 1 is a block diagram of a clock and data recovery circuit, in accordance with the conventional approach.
Figure 2:
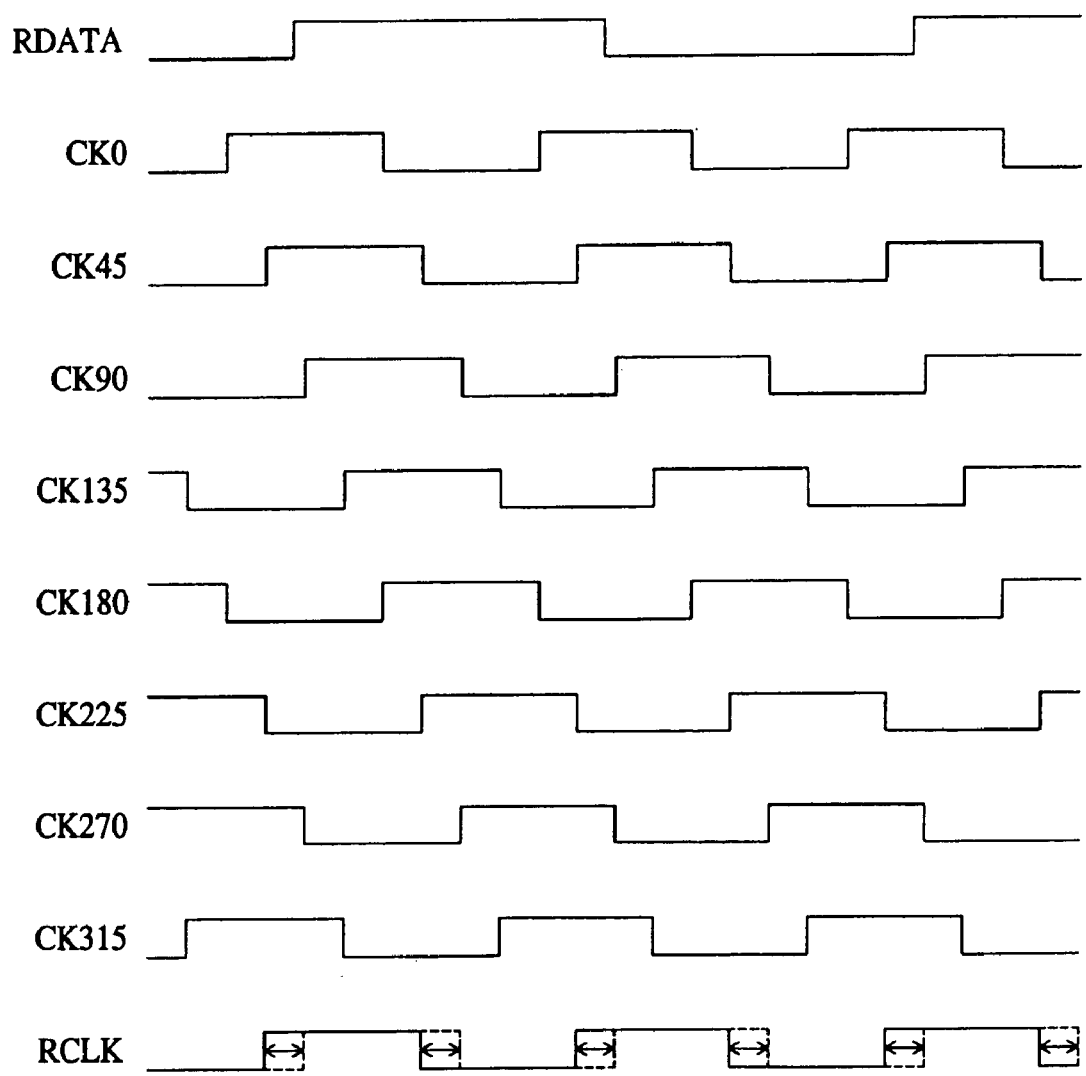
FIG. 2 is a timing diagram showing the operation of the clock and data recovery circuit shown in FIG. 1.

Korean Patent Application No. 2002-49325, filed on Aug. 20, 2002 and entitled: "Clock and Data Recovery Circuit," is incorporated by reference herein in its entirety.

Hereinafter, the present invention will be described in detail by describing preferred embodiments thereof with reference to the accompanying drawings.

Like reference numerals refer to like elements throughout the drawings.

Figure 3:
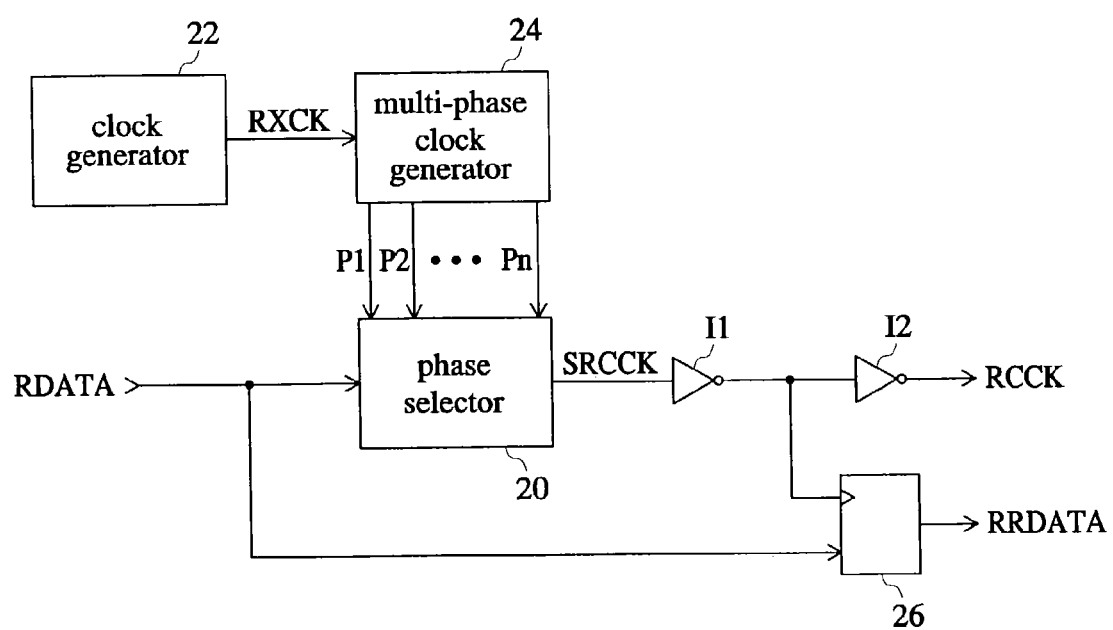
FIG. 3 is a block diagram of a clock and data recovery circuit in accordance with the present invention.

FIG. 3 illustrates an embodiment of a clock and data recovery circuit in accordance with the present invention.

Referring to FIG. 3, a clock and data recovery circuit in accordance with the present invention comprises a phase selector 20, a clock generator 22, a multi-phase clock generator 24, a D-flip-flop 26 and inverters I1, I2.

The clock generator 22 and the multi-phase clock generator 24 operate in the same manner as the clock generator 16 and the multi-phase clock generator 18, respectively, shown in FIG. 1.

The phase selector 20 selects one clock signal out of a plurality of clock signals P1, P2, . . . , Pn output from the multi-phase clock generator 24 in response to a received data RDATA and generates a clock signal SRCCK. The inverters I1, I2 buffer the clock signal SRCCK output from the phase selector 20 and generate a recovered clock signal RCCK. The D-flip-flop 26 receives the received data RDATA and generates a recovered data RRDATA synchronized with the recovered clock signal RCCK, in response to a signal output from the inverter I1.

Figure 4:
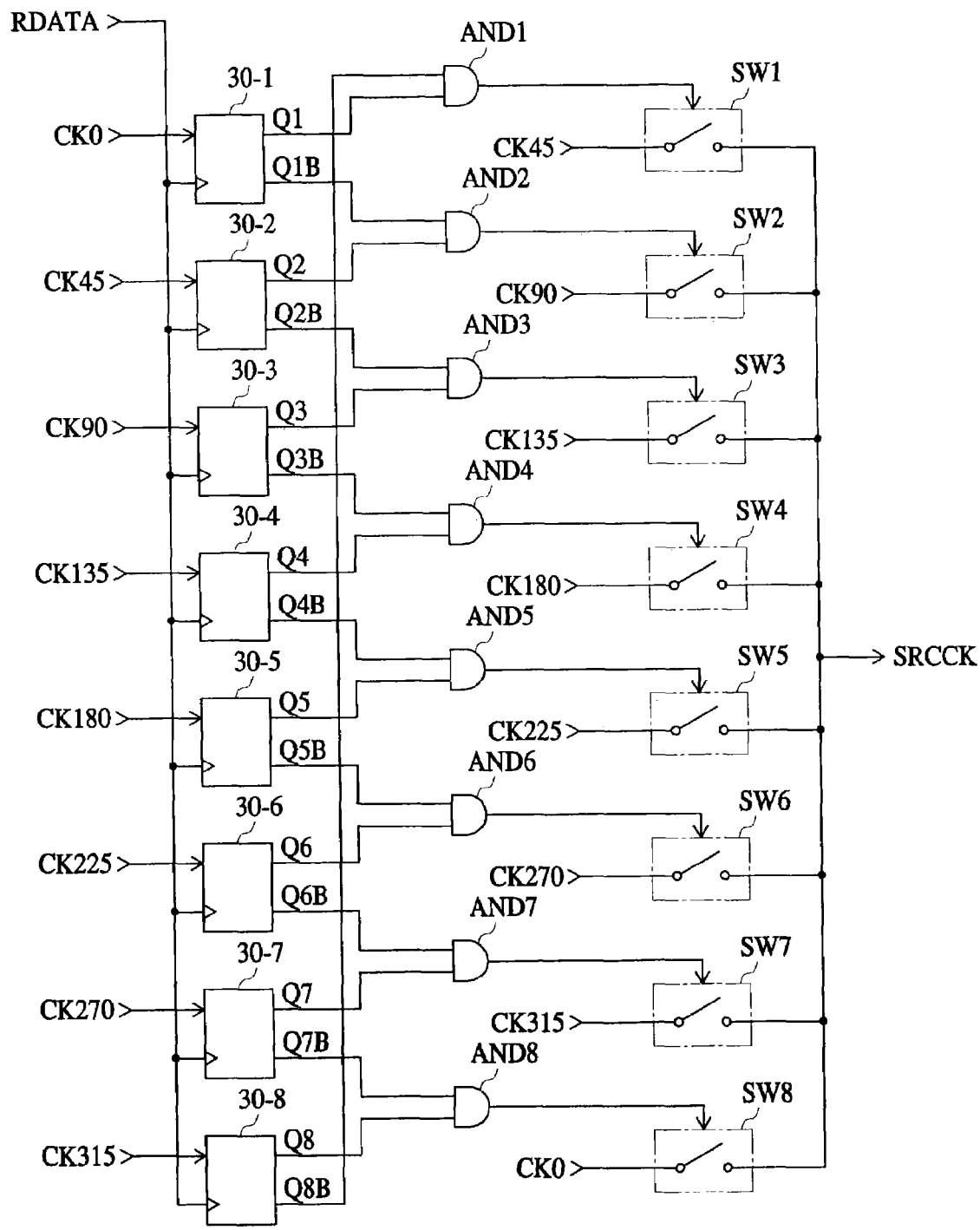
FIG. 4 is a circuit diagram of the clock and data recovery circuit shown in FIG. 3.

FIG. 4 illustrates an exemplary embodiment of a circuit diagram of the phase selector shown in FIG. 3. Referring to FIG. 4, the phase selector 20 comprises the D-flip-flops 30-1 to 30-8, AND gates AND1 to AND8 and switches SW1 to SW8.

The phase selector shown in FIG. 4 receives eight (8) clock signals CK0, CK45, CK90, CK135, CK180, CK225, CK270 and CK315, for example corresponding to outputs P1 . . . Pn of the multi-phase clock generator.

The D-flip-flops 30-1 to 30-8 receive the clock signals CK0, CK45, CK90, CK135, CK180, CK225, CK270 and CK315 received data RDATA. The AND gates AND1 and AND2 perform an AND operation of respective output signals Q1 to Q8 of corresponding D-flip-flops 30-1 to 30-8 and respective complementary output signals Q8B, Q1B to Q7B of respective D-flip-flops 30-8, 30-1 to 30-7. In this manner, the D-flip-flops 30-1 to 30-8 and the AND gates AND1 to AND8 detect a level transition of the clock signals from logic "low" level to logic "high" level of adjacent clock signals at rising edges of the received data RDATA. The switches SW1 to SW8 select one clock signal among the multiple clock signals CK45, CK90, CK135, CK180, CK225, CK270,CK 315 and CK0, and generates the selected one clock signal as the clock signal SRCCK in response to the output signals of the AND gates AND1 to AND8, respectively.

In the phase detector shown in FIG. 4, at the rising edges of the received data RDATA, if adjacent clock signals CKI (I is a natural number from 1 to N) and CK(I+1) have a logic "low" level and logic "high" level, respectively, a detection signal is generated and a clock signal CK(I+2) is generated as the selected clock signal SRCCK in response to the detection signal. The detection signal is-the output signals of the AND gates AND1 to AND8.

Figure 5A:
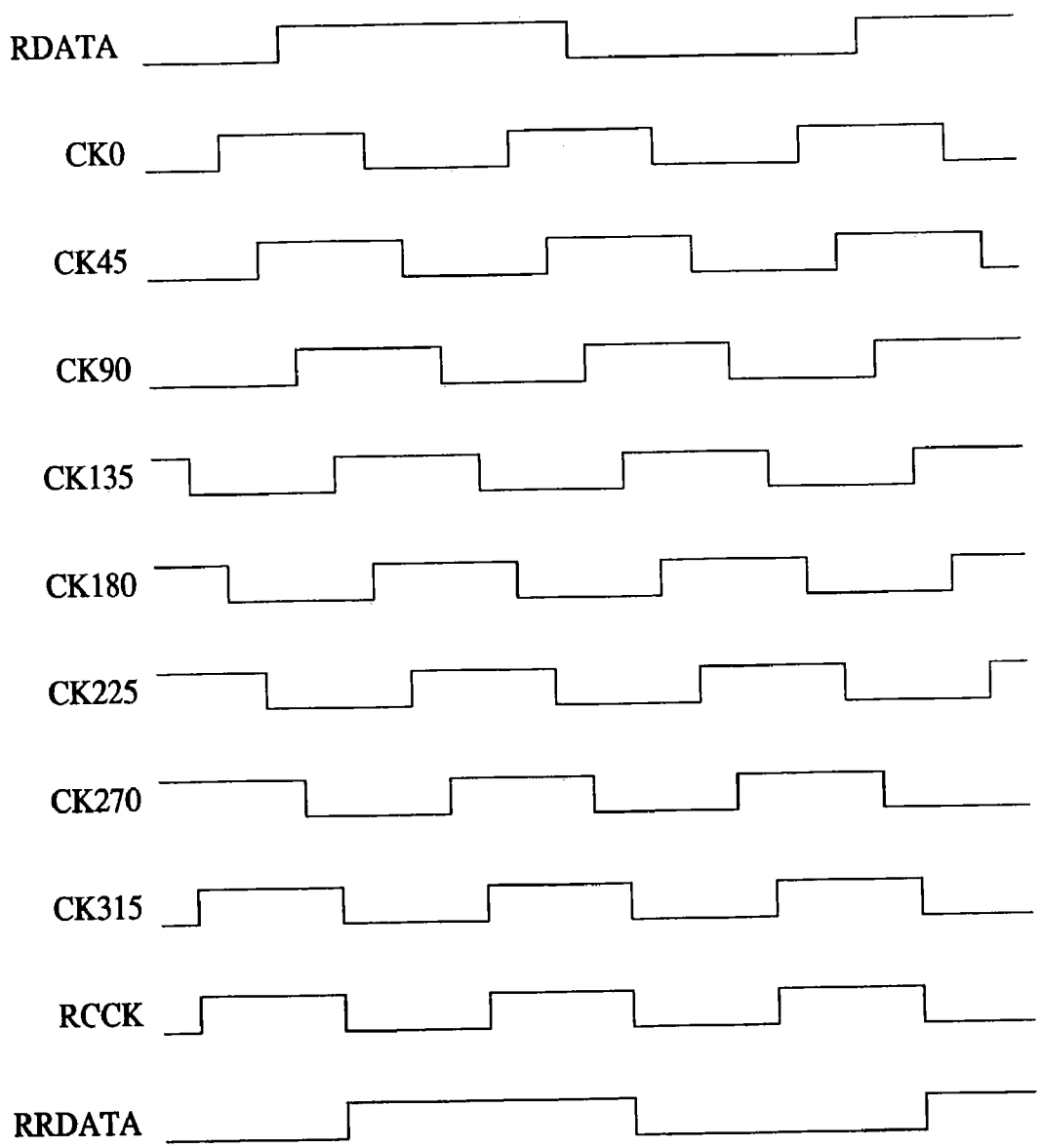
FIGS. 5A and 5B are timing diagrams showing the operation of the clock and data recovery circuit shown in FIG. 3.
Figure 5B:
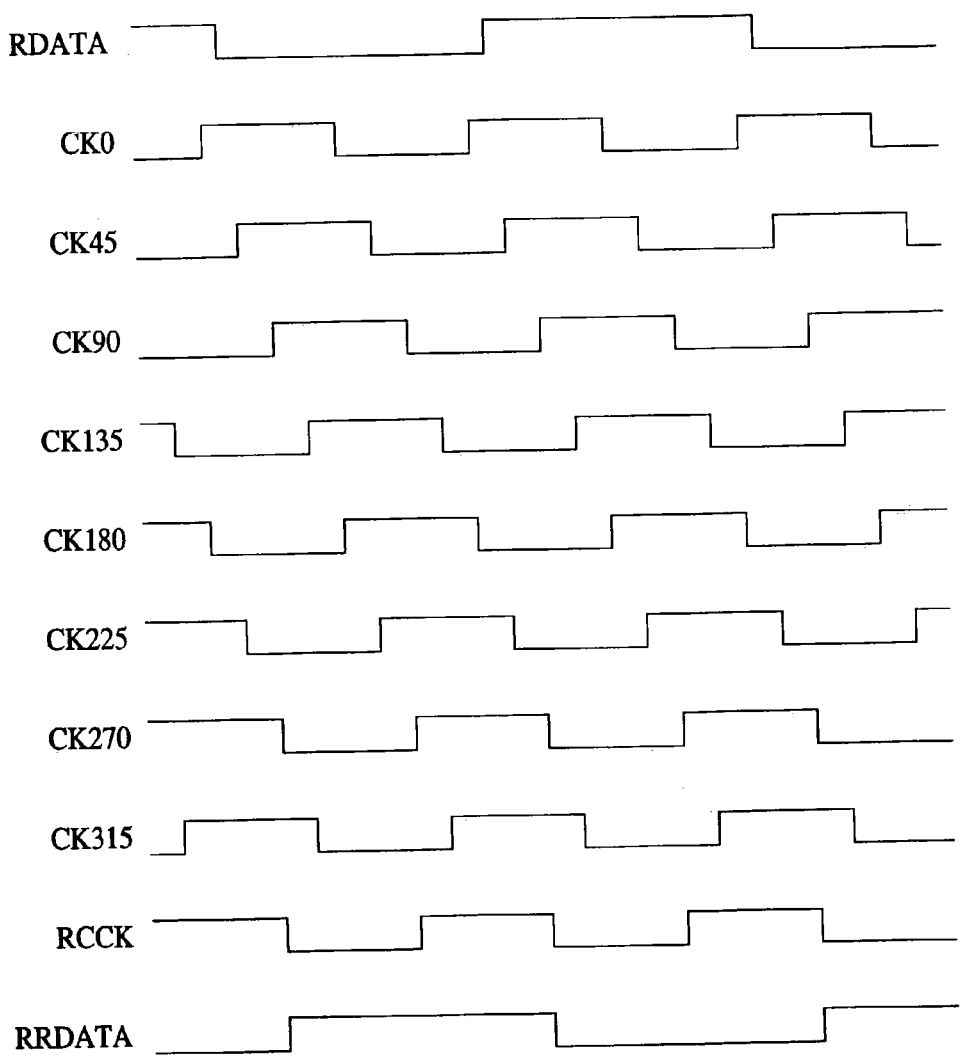

FIG. 5A and FIG. 5B illustrate timing diagrams that explain the operation of the clock and data recovery circuit in accordance with the present invention.

First, the operation of the clock and data recovery circuit in accordance with the present invention will be described below with reference to FIG. 5A.

The D-flip-flops 30-1 to 30-8 receive the clocks signals CK0, CK45, CK90, CK135, CK180, CK225, CK270 and CK315, respectively, and generate respective pairs of output signals (Q1, Q1B) to (Q8, Q8B). At this time, since the clock signals CK225, CK270 have a logic "low" level and a logic "high" level, respectively, complementary output signals Q6B, Q7 of the D-flip-flops 30-6, 30-7 have logic "high" level. The AND gate AND7 therefore generates an output signal at a logic "high" level, and the other AND gates AND1-AND6, AND8 generate respective output signals of a logic "low" level. Accordingly, the switch SW7 is turned on and the clock signal CK315 is generated as the clock signal SRCCK. That is, the clock signal CK315 is generated as the recovered clock signal RCCK. At this time, the other switches SW1-SW6, SW8 are turned off. The D-flip-flop 26 receives the received data RDATA and generates the recovered data RRDATA precisely synchronized with the recovered clock signal RCCK in response to the clock signal SRCCK.

Next, the operation of the clock and data recovery circuit in accordance with the present invention will be described below with reference to FIG. 5B.

At a rising edge of the received data RDATA, since the clock signal CK180 has logic "low" level and the clock signal CK225 has logic "high" level, both of the complementary output signal Q5B of the D-flip-flop 30-5 and the output signal Q6 of the D-flip-flop 30-6 have logic "high" level. The AND gate AND6 generates a signal having logic "high" level, and the switch SW6 is turned on and the clock signal CK270 is generated as the clock signal SRCCK. That is, the clock signal SRCCK is generated as the recovered clock signal RCCK. The D-flip-flop 26 receives the received data RDATA and generates the recovered data RRDATA precisely synchronized with the recovered clock signal RCCK in response to the inverted signal of the clock signal SRCCK.

As illustrated above in the timing diagrams of FIGS. 5A and 5B, since the clock and data recovery circuit in accordance with the present invention generates the recovered data RRDATA using the recovered clock signal RCCK, it generates the recovered data RRDATA precisely synchronized with the recovered clock signal RCCK.

Further, the clock and data recovery circuit in accordance with the present invention generates the recovered clock signal RCCK within one clock cycle.

Accordingly, the clock and data recovery circuit in accordance with the present invention is advantageous for use in a USB receiving unit according to USB standard 2.0 in which the received data and the recovered clock signal must be synchronized within a short time period.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A clock and data recovery circuit comprising:
   a clock signal generator that generates N clock signals, each clock signal having a phase difference of 360/N degrees from each other, wherein N denotes an integer, and wherein phases of the N clock signals are 360/N× K, wherein K denotes an integer from K=0 to N−1;
   a phase selector that selects an $(I+2)_{th}$ clock signal of the N clock signals as a recovered clock signal if an $I_{th}$ clock signal of the N clock signals is in a first state and if an $(I+1)_{th}$ clock signal of the N clock signals is in a second state when a logic level transition of a received data is detected, wherein I denotes an integer from 1 to N; and
   a recovered data generator that receives the received data and the recovered clock signal to generate a recovered data that is synchronized with the recovered clock signal output from the phase selector.

2. The clock and data recovery circuit according to claim 1, wherein the phase selector comprises:
   N flip-flops for receiving the N clock signals and generating N clock signals and N complementary clock signals when a level transition of the received data is detected;
   N AND gates for performing an AND operation of an $I_{th}$ complementary clock signal and an $I+1_{th}$ clock signal out of the N clock signals and the N complementary clock signals; and
   N switches for generating the $I+2_{th}$ clock signal as the recovered clock signal in response to corresponding output signals of the N AND gates.

3. The clock and data recovery circuit according to claim 2, wherein the recovered data generator receives the received data and generates the recovered data in response to the complementary signal of the recovered clock signal.

4. A method for recovering clock and data information from a signal comprising:
   generating a plurality of clock signals, each clock signal having a phase difference of 360/N degrees from each other, wherein N denotes an integer, and wherein phases of the N clock signals are 360/N×K, wherein K denotes an integer from K=0 to N−1;
   selecting an $(I+2)_{th}$ clock signal of the N clock signals as a recovered clock signal if an $I_{th}$ clock signal of the N clock signals is in a first state and if an $(I+1)_{th}$ clock signal of the N clock signals is in a second state when a logic level transition of a received data is detected, wherein I denotes an integer from 1 to N; and
   receiving the received data and the recovered clock signal to generate the recovered data that is synchronized with the recovered clock signal.

5. The method according to claim 4, wherein the step of generating the recovered clock signal comprises steps of:
   generating N clock signals and N complementary clock signals by receiving the N clock signals when a level transition of the received data is detected;
   generating N AND operation signals by performing an AND operation of an $I_{th}$ complementary clock signal and an $I+1_{th}$ clock signal out of the N clock signals and the N complementary clock signals; and
   generating an $I+2_{th}$ clock signal as the recovered clock signal in response to the N AND operation signals.

6. The method according to claim 5, wherein the step of generating the recovered data generates the recovered data by using the received data in response to a complementary signal of the recovered clock signal.

* * * * *

UNITED STATES PATENT AND TRADEMARK OFFICE
CERTIFICATE OF CORRECTION

PATENT NO. : 7,254,201 B2  Page 1 of 1
APPLICATION NO. : 10/634279
DATED : August 7, 2007
INVENTOR(S) : Ju-Hyung Kim It is certified that error appears in the above-identified patent and that said Letters Patent is hereby corrected as shown below:

Column 6, line 5 delete "an clock" and insert -- an $I_{th}$ clock --

Signed and Sealed this

Twelfth Day of August, 2008

JON W. DUDAS
*Director of the United States Patent and Trademark Office*